Jan. 6, 1970 A. CSICSATKA 3,488,599
DETECTOR AND AUTOMATIC GAIN CONTROL CIRCUITS
INCLUDING BIAS STABILIZATION
Filed April 30, 1965 2 Sheets-Sheet 1

INVENTOR
ANTAL CSICSATKA,
BY Norman C. Fulmer
HIS ATTORNEY.

Jan. 6, 1970 A. CSICSATKA 3,488,599
DETECTOR AND AUTOMATIC GAIN CONTROL CIRCUITS
INCLUDING BIAS STABILIZATION
Filed April 30, 1965 2 Sheets-Sheet 2

INVENTOR:
ANTAL CSICSATKA,
BY Norman C. Fulmer
HIS ATTORNEY.

3,488,599

DETECTOR AND AUTOMATIC GAIN CONTROL CIRCUITS INCLUDING BIAS STABILIZATION

Antal Csicsatka, Utica, N.Y., assignor to General Electric Company, a corporation of New York Filed Apr. 30, 1965, Ser. No. 452,137
Int. Cl. H03d *1/18*
U.S. Cl. 329—101 13 Claims

ABSTRACT OF THE DISCLOSURE

A detector circuit including a detector device serially connected with resistance means and a source of direct voltage to provide a stabilized automatic gain control voltage across the detector device, the detector device in a preferred embodiment being a transistor having its collector and base electrodes connected directly together.

This invention relates to electrical circuits, and particularly to detector and automatic gain control circuits used in radios and the like for receiving amplitude modulation signals.

Various detector circuit arrangements have been used for detecting amplitude modulated signals and also for simultaneously providing an automatic gain control voltage which varies in accordance with the strength of the modulated carrier wave. The automatic gain control voltage is used to vary the gain of one or more amplifier stages preceding the detector, in such a manner that the modulated carrier wave applied to the detector will have a substantially constant amplitude, so that strong and weak received signals will have substantially the same "loudness" after detection. It is desired that the detector function with good efficiency and fidelity, in addition to providing the automatic gain control voltage. Each gain-controlled stage must be supplied with a suitable fixed bias voltage in addition to the variable gain-control voltage. In a battery-operated radio, this bias voltage tends to vary when the battery voltage reduces due to aging or depletion of the battery. This undesirably causes the gain of the controlled amplifier stage to vary as a function of battery voltage rather than to vary entirely as a function of carrier wave amplitude, and also is likely to cause the automatic gain control voltage to vary or drift beyond the range that can be accommodated by the amplifier to which this voltage is applied, thereby causing distortion.

An object of the invention is to provide improved detector and automatic gain control circuits.

Another object is to provide an improved detector circuit having increased efficiency.

A further object is to provide an improved detector circuit which provides a stabilized biased automatic gain control voltage.

An additional object is to achieve the foregoing objects with simple and inexpensive circuitry.

Still other objects will be apparent from the following description and claims, and from the accompanying drawing.

The improved detector and automatic gain control circuit of the invention comprises, briefly and in a preferred embodiment, a detector device such as a diode or specially connected transistor, means connected to apply an amplitude modulated carrier wave to the terminals of the detector device, and a resistance means and a direct voltage source connected in a direct-current conductive series circuit across said detector device terminals whereby the circuit will demodulate the amplitude modulated carrier wave and also will provide a stabilized biased automatic gain control voltage across said detector device terminals which is relatively stable and unvarying with respect to changes in voltage of the voltage source. The improved detector of the invention, which is particularly useful in the aforesaid detector and amplifier gain control circuit, comprises, briefly and in a preferred embodiment, a transistor having base, collector, and emitter electrodes, and means connecting together the base and collector electrodes, said base and collector electrodes constituting a first detector terminal and said emitter electrode constituting a second detector terminal.

Figure 1:
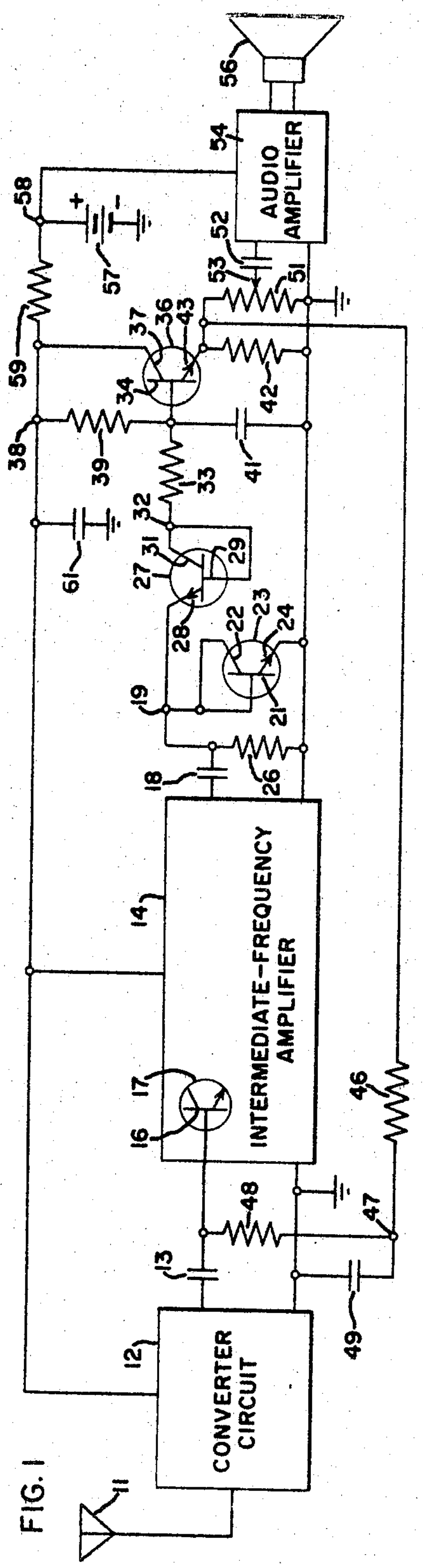
FIG. 1 is an electrical schematic diagram of a preferred embodiment of the invention, as applied to a radio receiver.

Now referring to the receiver diagram shown in FIG. 1, an antenna 11 picks up the amplitude modulated radio signals and applies them to a converter circuit 12 which may be of conventional type or converting the received radio-frequency signal to an intermediate-frequency signal. The intermediate-frequency signal is coupled via a capacitor 13 to the input of an intermediate-frequency amplifier 14. As shown, the input of the intermediate frequency amplifier 14 comprises the base electrode 16 of a transistor 17. The output signal of the intermediate-frequency amplifier 14 is applied, via a coupling capacitor 18, to a detector terminal 19. The base electrode 21 and collector electrode 22 of a detector transistor 23 are connected together and to the terminal 19. The emitter electrode 24 of the detector transistor 22 is connected to electrical ground. A resistor 26 is connected between the terminal 19 and electrical ground, if required to provide a signal return path. A second detector transistor 27 has an emitter electrode 28 connected to the detector input terminal 19, and a base electrode 29 and collector electrode 31 connected together and to a detector circuit output terminal 32. A resistor 33, if required for obtaining a proper value of bias voltage, is connected between the detector output terminal 32 and the base electrode 34 of an emitter-follower amplifier transistor 36. A collector electrode 37 of the transistor 36 is connected to a terminal 38 of operating voltage. A resistor 39 is connected between the terminal 38 and the base electrode 34, and a detector output capacitor 41 is connected between the base electrode 34 and electrical ground. A resistor 42 is connected between the emitter electrode 43 of the transistor 36, and electrical ground.

An automatic gain control voltage coupling resistors 46 is connected between the emitter electrode 43 and a point 47 from which a resistor 48 is connected to the input electrode 16 of the intermediate frequency amplifier 14. An automatic gain control voltage filter capacitor 49 is connected between the point 47 and electrical ground.

A volume control potentiometer 51 is connected across the emitter follower output resistor 42, and a coupling capacitor 52 is connected between an adjustable tap 53 of the potentiometer 51 and the input of an audio amplifier 54. A loudspeaker 56 is connected to the signal output of the audio amplifier 54. A battery 57 or other suitable direct voltage power source is connected between electrical ground and a point 58, which point is connected to the audio amplifier 54 to supply operating voltage thereto. A resistor 59 is connected between the point 58 and terminal 38, in order to filter and drop the operating voltage to a suitable value at the terminal 38. A filter capacitor 61 is connected between the terminal 38 and electrical ground. Operating voltage connections are made from the terminal 38 to the intermediate frequency amplifier 14 and to the converter circuit 12, as shown.

The transistor 23 functions as a shunt detector, and the transistor 27 functions as a series detector, for the modulated intermediate frequency carrier wave, and, in addition to demodulating the amplitude modulated intermediate frequency carrier wave, these detectors provide an automatic gain control voltage which is a direct voltage that varies in accordance with the signal strength of the intermediate-frequency carrier wave. Shunt and series detector per se are well known.

The transistor detector circuits comprising the transistors 23 and 27 connected as shown, in accordance with the invention, are more efficient, and provide a greater value of detected audio output signal, than do conventional diode detectors.

Figure 2:
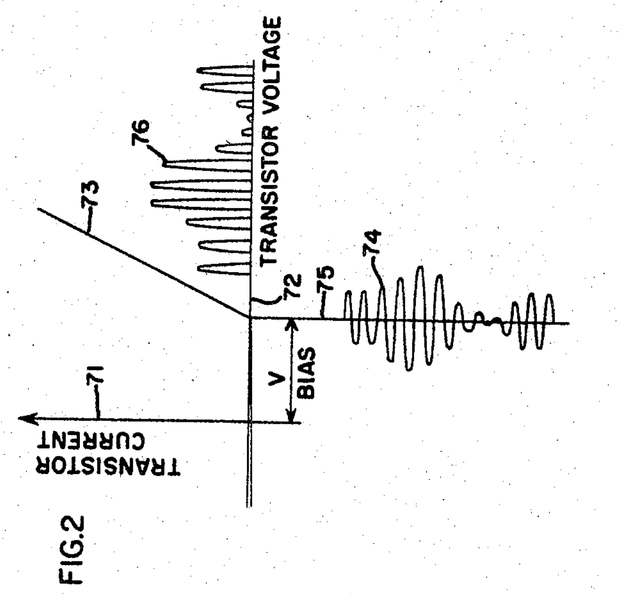

FIG. 2 illustrates the functioning of each of the transistor detectors (both the shunt and parallel detectors) of the invention. The vertical coordinate 71 represents the transistor emitter-collector current, and the horizontal coordinate 72 represents signal voltage of the detector. The curve 73 is the idealized current versus voltage characteristic of each transistor detector connected as shown in FIG. 1 of the drawing. The input signal 74, comprising the amplitude-modulated intermediate frequency carrier wave, is applied to the detector characteristic curve 73 on the bias voltage line 75, and the detected audio output signal 76 is provided at an amplitude which is relatively great due to the relatively great slope of the characteristic curve 73.

Figure 3:
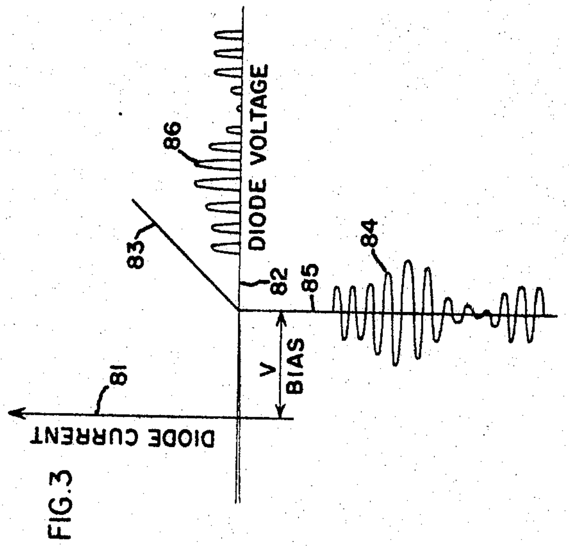
FIGS. 2 and 3 are characteristic curves which illustrate the improved detector efficiency of the invention as compared to a conventional diode detector circuit.

By way of comparison, FIG. 3 shows the current-voltage characteristics of a conventional diode detector. The vertical coordinate 81 represents diode current, and the horizontal coordinate 82 represents the diode voltage. The curve 83 is the idealized current versus voltage characteristic. The amplitude-modulated intermediate frequency carrier wave 84 (same as 74 in FIG. 2) is applied to the diode characteristic 83 on the bias voltage line 85, and the detector produces an audio output signal 86 having an amplitude dependent on the slope of the characteristic curve 83. As will be seen from a comparison of FIGS. 2 and 3, the transistor detector circuit of the invention is considerably more efficient and provides a greater audio output signal 76, than does the conventional diode detector. This is due to the considerably steeper slope of the characteristic 73 of the transistor detector circuit of the invention as compared to the slope of the diode characteristic 83. The greater detector efficiency of the invention is especially important at low carrier wave levels.

Each of the transistor detectors 23 and 27 provides a detected audio output signal, and these signals combine to provide a detected output signal of increased amplitude from that of either of the individual detectors.

In addition to providing a detected audio signal, each of the transistor detectors 23 and 27 provides, via rectification of the intermediate-frequency carrier wave, a direct voltage having an amplitude proportional to the amplitude of the intermediate-frequency carrier wave, and these two direct-current rectified voltages add together to provide an automatic gain control voltage at the output terminal 32 of the detector circuit. In the particular embodiment of the circuit shown in FIG. 1, this automatic gain control voltage is of positive polarity with respect to electrical ground, and becomes less positive for larger amplitudes of intermediate-frequency carrier waves.

In accordance with the present invention, the detector circuit furthermore provides a stabilized biased automatic gain control voltage in the following manner. The detector transistors 23 and 27 are connected in series in a direct current path through which current flows from the battery 57, via resistance means 59, 39, and 33, through the emitter-collector junction of the transistor 27, and then through the emitter-collector junction of transistor 23, to electrical ground and to the other terminal of the battery 57. The connection of the base to the collector of each of the transistors 23 and 27, provides 100% negative feedback, and stabilizes the emitter-collector direct voltage of each of these transistors, as is described and claimed in co-pending patent application Ser. No. 339,816, now abandoned, assigned to the same assignee as the present invention. The stabilized bias feature of the invention is also achieved, though to a lesser extent, if other detector devices such as diodes are used in lieu of either or both of the transistor detectors 23 and 27.

The value of resistance of resistor 33 is relatively small, as compared to that of resistor 39, and is only sufficient to provide a direct voltage drop to increase the value of bias to suitable values at the base electrode 34 of the emitter-follower transistor amplifier 36 and at the base electrode 16 of the gain-controlled transistor 17. Therefore, as the voltage of the battery 57 reduces due to use, the voltage drop across resistors 39 and 59 will decrease the most appreciably, and the direct voltage at the detector circuit output terminal 32 will remain substantially constant due to the aforesaid voltage stabilization provided by the detector circuit comprising the transistors 23 and 27. The value of the stabilized bias voltage will drop only slightly, with a drop in battery voltage, due to the voltage drop across the coupling resistor 33.

Figure 4:
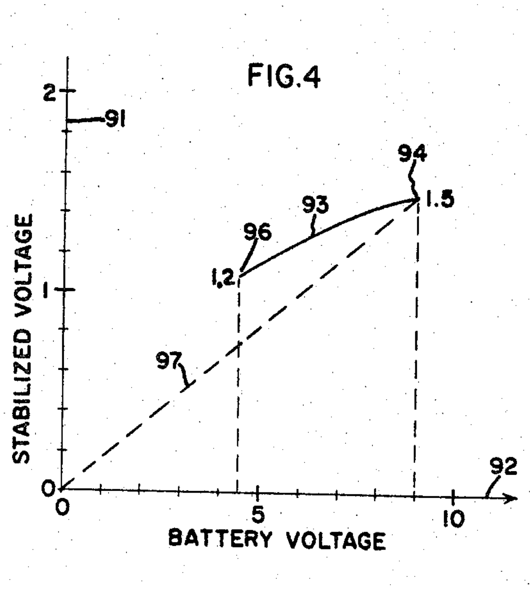
FIG. 4 is a plot of stabilized automatic gain control bias voltage versus power supply voltage.

FIG. 4 illustrates the voltage stabilization achieved by the detector circuit. In FIG. 4, the vertical coordinate 91 represents the stabilized voltage at the base electrode 34 of the emitter-follower transistor 36, and the horizontal coordinate 92 represents voltage of the battery 57. The curve 93 represents the stabilized voltage at the base electrode 34, versus the battery voltage. This stabilized voltage is 1.5 volts for a battery voltage of 9 volts, as indicated at point 94, and reduces to 1.2 volts when the battery voltage drops to 4.5 volts, or one-half the original voltage value, as indicated at the point 96. By way of comparison, the dashed line 97 illustrates the relatively greater change in direct voltage at the base electrode 34 which would occur without the aforesaid voltage stabilization provided by the invention. If other detector devices such as diodes are employed in lieu of the transistor detectors 23 and 27, the voltage stabilization curve will lie intermediate the curves 93 and 97. Thus, in accordance with the invention, the automatic gain control voltage reference value, which functions as a bias voltage, is stabilized at a substantially constant value, thereby rendering the automatic gain control action substantially independent from, and unaffected by, a drop in battery voltage. This not only stabilizes the radio against change in volume with drop in battery voltage, but also insures that the range of automatic gain control voltage will suitably fall within the bias range limits of the intermediate-frequency amplifier transistor 17 for satisfactory and undistorted functioning thereof.

Figure 5:
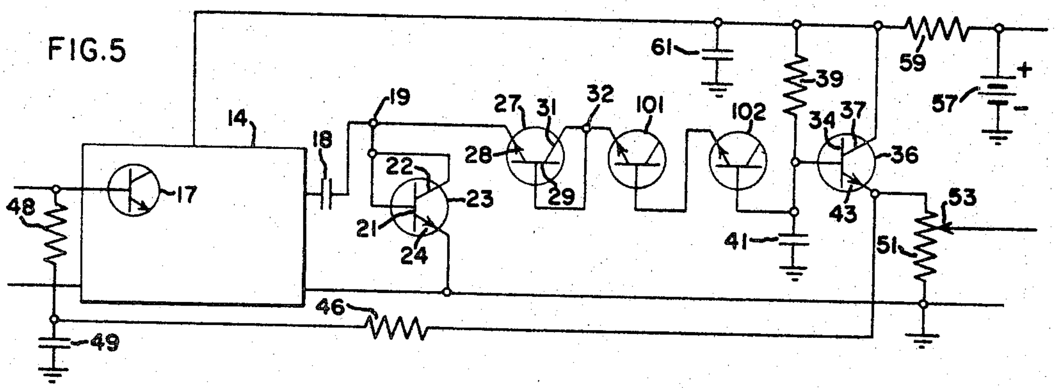
FIGS. 5 and 6 are schematic diagrams of alternative embodiments of the invention.
Figure 6:
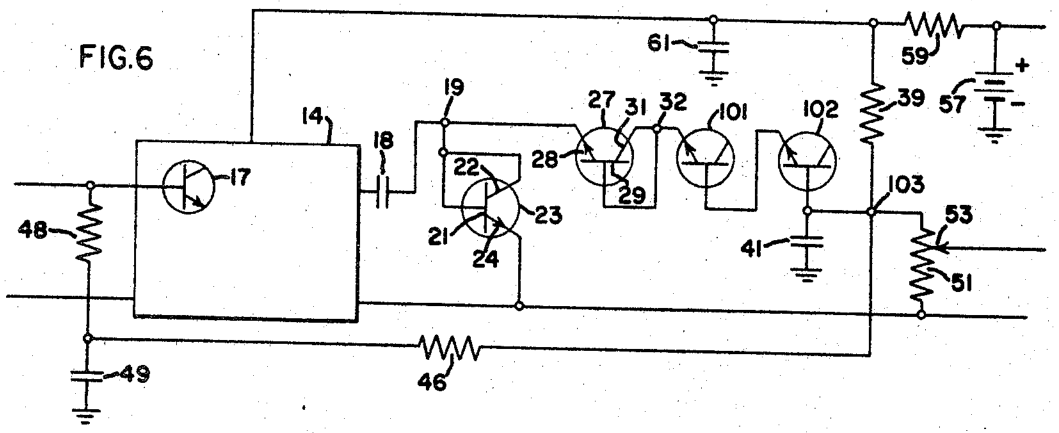

In FIGS. 5 and 6, which show a portion of the radio of FIG. 1, the elements corresponding to those of FIG. 1 are given the same reference numerals as in FIG. 1.

FIG. 5 is the same as FIG. 1 except that the resistors 26 and 33 of FIG. 1 are eliminated, and two semiconductor diodes 101 and 102 are inserted in series between the detector output terminal 32 and the base electrode 34 of the emitter follower transistor 36. The diodes 101 and 102 may comprise, if desired, transistors, as shown, of which the emitter and base electrodes are used as the diode electrodes. The direct voltage drops across the diodes 101 and 102 are such as to achieve the desired bias voltage increase between the detector circuit output terminal 32 and the emitter follower base electrode 34, to achieve proper biasing on the emitter follower 36 and also on the gain-controlled stage 17.

FIG. 6 is the same as FIG. 5, except that the emitter-follower transistor stage 36 is eliminated, and the output of the diodes 101 and 102 is connected directly to the point 103 at the upper end of the volume control 51.

An advantage of the arrangement of FIGS. 5 and 6 over that of FIG. 1, is that the diodes 101 and 102 provide the required increase in direct voltage for automatic gain control biasing reference voltage value, while at the same time they offer appreciably little resistance in the A-C signal path, and therefore permit greater audio signal output at the base 34 of the emitter follower 36 and/or at the volume control potentiometer 51.

In the circuit shown, using silicon transistors, the stabilized direct voltage will be approximately one-half volt at point 19; approximately one volt at point 32, approximately 1½ volts at the base electrode 34 of the emitter-follower stage 36; approximately 0.95 volt at the emitter electrode 43 of the emitter-follower stage 36; and approximately one-half volt at the base electrode 16 of the intermediate-frequency amplifier stage 17.

The emitter-follower stage 36 has a relatively high input impedance, which is desirable for best functioning of the detector circuit. When this emitter-follower stage is omitted, as in FIG. 6, the value of the AGC coupling resisor 46 must be increased so as not to unduly load the output of the detector circuit. This increases the voltage drop across the resistor 46 by about 0.6 volt; which is the same as the base-to-emitter voltage drop of the emitter-follower transistor 36. Thus, with presently available transistors for the detector transistors 23 and 27 and the gain-conrolled transistor 17, means such as the resistor 33 (FIG. 1) or diodes 101 and 102 (FIGS. 5 and 6) are required for obtaining proper bias voltage. If suitable transistors were available such that the biasing requirements could be achieved, then the resistor 33 and diodes 101 and 102 could be eliminated and replaced by direct connections.

In the circuits shown in the drawing, the orientation of the transistors—i.e., the direction of connection of their electrodes in the circuits, may be reversed if a reversed polarity of operating voltage is employed or if transistors of opposite conductivity type (PNP) are employed instead of the type shown (NPN).

From the foregoing, it will be realized that I have invented improved detector and automatic gain control circuits which provide stabilized bias voltage in addition to their functions of detecting and providing an automatic gain voltage, and I also have invented a detector having increased efficiency, and, as a further feature of the invention, these are achieved with simple and inexpensive circuitry.

While preferred embodiments and modifications of the invention have been shown and described, various other embodiments and modifications thereof will be apparent to those skilled in the art and will fall within the scope of the invention as defined in the following claims.

What I claim is:

1. A detector and automatic gain control circuit, comprising a pair of signal input terminals and a signal output terminal means for impressing an amplitude modulated carrier wave across said signal input terminals, a first detector device connected across said signal input terminals, a second detector device connected between said signal output terminal and a first one of said signal input terminals, and a resistance means and a direct voltage source serially connected between said signal output terminal and the second one of said signal input terminals, said first and second detector devices, said resistance means, and said direct voltage source thereby defining a series circuit, whereby the circuit will demodulate said modulated carrier wave and also will provide a stabilized biased automatic gain control voltage.

2. A circuit as claimed in claim 1, in which said detector devices are oriented in said series circuit so that stabilized direct voltages are developed thereacross in series additive polarity between said signal output terminal and said second input terminal.

3. A circuit as claimed in claim 2, including a resistance means interposed between said signal output terminal and said second detector device to increase the value of direct voltage at said signal output terminal.

4. A circuit as claimed in claim 2, including at least one semiconductor device interposed between said signal output terminal and said second detector device and oriented to increase the value of direct voltage at said signal output terminal.

5. A circuit as claimed in claim 2, including an emitter-follower stage comprising a transistor having base, collector, and emitter electrodes, direct-current conductive means connecting said base electrode to said signal output terminal, means connecting said collector electrode to said direct voltage source, and a load resistor connected between said emitter electrode and said second signal input terminal, whereby the demodulated signal and the stabilized biased automatic gain control voltage are provided at said load resistor and whereby said emitter-follower stage is biased by said stabilized biased automatic gain control voltage.

6. A detector and automatic gain control circuit comprising a transistor having base, collector, and emitter electrodes, means directly connecting together said base and collector electrodes, said base and collector electrodes together constituting a first detector terminal and said emitter electrode constituting a second detector terminal, means connected to apply an amplitude modulated carrier wave to said first and second detector terminals, and a resistance means and a direct voltage source connected in a series circuit across said first and second detector terminals, whereby the circuit will demodulate said modulated carrier wave and also will provide a stabilized biased automatic gain control voltage.

7. A detector and automatic gain control circuit comprising a first transistor having base, collector, and emitter electrodes, a pair of signal input terminals, means connecting said base and collector electrodes together and to one of said signal input terminals, means connecting said emitter electrode to the other of said signal input terminals, means for impressing an amplitude modulated carrier wave across said signal input terminals, a second transistor having base, collector, and emitter electrodes, means connecting the last-named base and collector electrodes together to form a first connection point, the last-named emitter constituting a second connection point, a signal output terminal, means respectively connecting said connection points to said signal output terminal and to a first one of said signal input terminals, and a resistance means and a direct voltage source connected in a direct-current conductive series circuit between said signal output terminal and the second one of said signal input terminals, whereby the circuit will demodulate said modulated carrier wave and also will provide a stabilized biased automatic gain control voltage.

8. A circuit as claimed in claim 7, in which said transistors are oriented in the circuit with respect to their conductivity types and polarity of said direct voltage source so that stabilized direct voltages are developed thereacross in series additive polarity between said signal output terminal and said second signal input terminal.

9. A circuit as claimed in claim 8, including a resistance means interposed between said signal output terminal and said second transistor to increase the value of direct voltage at said signal output terminal.

10. A circuit as claimed in claim 8, including at least one semiconductor device interposed between said signal output terminal and said second transistor and oriented to increase the value of direct voltage at said signal output terminal.

11. A circuit as claimed in claim 8, including an emitter-follower stage comprising a transistor having base, collector, and emitter electrodes, direct-current conductive means connecting the last-named base electrode to said signal output terminal, means connecting the last-named collector electrode to said direct voltage source, and a load resistor connected between the last-named emitter electrode and said second signal input terminal, whereby the demodulated signal and the stabilized biased automatic gain control voltage are provided at said load resistor and whereby said emitter-follower stage is biased by said stabilized biased automatic gain control voltage.

12. A detector circuit for demodulating an amplitude modulated carrier wave, comprising a transistor having base, collector, and emitter electrodes, means directly connecting together said base and collector electrodes said base and collector electrodes together constituting a first detector terminal and said emitter electrode constituting a second detector terminal, and means connected to apply said amplitude modulated carrier wave to said first and second detector terminals.

13. A detector circuit for demodulating an amplitude modulated carrier wave, comprising a first transistor having base, collector, and emitter electrodes, a pair of signal input terminals, means connecting said base and collector electrodes together and to one of said signal input terminals, means connecting said emitter electrode to the other of said signal input terminals, means for impressing an amplitude modulated carrier wave across said signal input terminals, a second transistor having base, collector, and emitter electrodes, means connecting the last-named base and collector electrodes together to form a first connection point, the last-named emitter constituting a second connection point, a signal output terminal, and means respectively connecting said connection points to said signal output terminal and to one of said signal input terminals.

References Cited

UNITED STATES PATENTS

| | | | |
|---|---|---|---|
| 2,673,294 | 3/1954 | Battell et al. | 329—204 X |
| 2,832,888 | 4/1958 | Houston | 329—204 |
| 2,866,892 | 12/1958 | Barton | 329—179 X |
| 3,233,177 | 2/1966 | Stone | 325—400 |

ALFRED L. BRODY, Primary Examiner

U.S. Cl. X.R.

307—235; 325—319, 400, 492; 329—178